(12) United States Patent
He et al.

(10) Patent No.: US 10,903,039 B2
(45) Date of Patent: Jan. 26, 2021

(54) VACUUM CONDITION PROCESSING APPARATUS, SYSTEM AND METHOD FOR SPECIMEN OBSERVATION

(71) Applicant: Focus-eBeam Technology (Beijing) Co., Ltd., Beijing (CN)

(72) Inventors: Wei He, Beijing (CN); Shuai Li, Beijing (CN); Peng Wang, Beijing (CN)

(73) Assignee: FOCUS-EBEAM TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/740,077

(22) PCT Filed: Sep. 5, 2017

(86) PCT No.: PCT/CN2017/100486
§ 371 (c)(1),
(2) Date: Dec. 27, 2017

(87) PCT Pub. No.: WO2018/099156
PCT Pub. Date: Jun. 7, 2018

(65) Prior Publication Data
US 2020/0035443 A1 Jan. 30, 2020

(30) Foreign Application Priority Data
Dec. 1, 2016 (CN) .......................... 2016 1 1090486

(51) Int. Cl.
*H01J 37/20* (2006.01)
*H01J 37/09* (2006.01)
(Continued)

(52) U.S. Cl.
CPC .............. *H01J 37/20* (2013.01); *H01J 37/09* (2013.01); *H01J 37/244* (2013.01); *H01J 37/28* (2013.01);
(Continued)

(58) Field of Classification Search
CPC .......... H01J 37/09; H01J 37/20; H01J 37/244; H01J 37/28; H01J 37/18; H01J 2237/0245;
(Continued)

(56) References Cited

U.S. PATENT DOCUMENTS

| 4,516,026 A | 5/1985 | Jouffrey |
| 4,584,479 A * | 4/1986 | Lamattina ............... F16J 15/006 |
| | | 219/121.22 |

(Continued)

FOREIGN PATENT DOCUMENTS

| CN | 103477415 A | 12/2013 |
| CN | 106783493 A | 5/2017 |

(Continued)

OTHER PUBLICATIONS

International Search Report in international application No. PCT/CN2017/100486, dated Nov. 28, 2017.
(Continued)

*Primary Examiner* — Wyatt A Stoffa
(74) *Attorney, Agent, or Firm* — Syncoda LLC; Feng Ma

(57) ABSTRACT

A vacuum condition processing apparatus is provided, the top of which is connected to an external charged particle beam generating device, and the apparatus includes: a suction cup in contact with the specimen to be observed or the stage holding the specimen, a first gas controlling device connected to an external gas supplying system, and a second gas controlling device connected to an external pumping system; a window is deployed at the top of the apparatus, through which the particle beam can go into the apparatus; the first gas controlling device is arranged to connect the gas supplying system and the suction cup; the second gas controlling device is arranged to connect the gas pumping
(Continued)

system and the suction cup. Also disclosed is a specimen observation system and method.

18 Claims, 14 Drawing Sheets

(51) Int. Cl.
  *H01J 37/244* (2006.01)
  *H01J 37/28* (2006.01)
(52) U.S. Cl.
  CPC . *H01J 2237/2001* (2013.01); *H01J 2237/202* (2013.01); *H01J 2237/2007* (2013.01); *H01J 2237/2802* (2013.01)
(58) Field of Classification Search
  CPC ........... H01J 2237/162; H01J 2237/188; H01J 2237/2001; H01J 2237/2002; H01J 2237/2003; H01J 2237/2007; H01J 2237/202; H01J 2237/2605; H01J 2237/2802
  See application file for complete search history.

(56) References Cited

U.S. PATENT DOCUMENTS

| | | | | |
|---|---|---|---|---|
| 5,493,125 A * | 2/1996 | Okayama | ................. | H01J 37/18 250/441.11 |
| 6,414,323 B1 | 7/2002 | Abe | | |
| 6,894,288 B2 * | 5/2005 | Muller | .................... | H01J 37/20 250/306 |
| 6,897,443 B2 | 5/2005 | Gross | | |
| 6,943,352 B2 | 9/2005 | Hayn | | |
| 7,220,963 B2 | 5/2007 | Gross | | |
| 8,859,992 B2 | 10/2014 | Bean | | |
| 9,679,741 B2 * | 6/2017 | Novak | .................... | H01J 37/18 |
| 2003/0178582 A1 * | 9/2003 | Norioka | ................... | H01J 37/21 250/492.3 |
| 2004/0094710 A1 * | 5/2004 | Muller | .................... | H01J 37/20 250/306 |
| 2004/0217297 A1 * | 11/2004 | Moses | ..................... | H01J 37/20 250/441.11 |
| 2004/0238739 A1 * | 12/2004 | Gross | ...................... | H01J 37/28 250/310 |
| 2005/0103272 A1 | 5/2005 | Koops | | |
| 2005/0178966 A1 | 8/2005 | Gross | | |
| 2006/0284090 A1 | 12/2006 | Koops | | |
| 2009/0121132 A1 | 5/2009 | Koops | | |
| 2010/0224780 A1 * | 9/2010 | Spruck | .................. | H01J 37/228 250/309 |
| 2011/0031394 A1 * | 2/2011 | Knowles | ............... | H01J 37/301 250/307 |
| 2012/0091337 A1 * | 4/2012 | Bean | ....................... | H01J 37/18 250/307 |
| 2012/0091338 A1 * | 4/2012 | Buijsse | ................... | H01J 37/16 250/307 |
| 2012/0112062 A1 * | 5/2012 | Novak | .................. | H01J 37/244 250/307 |
| 2015/0129763 A1 | 5/2015 | Ominami et al. | | |
| 2019/0287760 A1 * | 9/2019 | He | .......................... | H01J 37/18 |

FOREIGN PATENT DOCUMENTS

| | | |
|---|---|---|
| CN | 206332001 U | 7/2017 |
| EP | 1367629 A2 | 12/2003 |
| EP | 2450934 A2 | 5/2012 |
| JP | H11288529 A | 10/1999 |
| JP | 2007273187 A | 10/2007 |
| JP | 2008047310 A | 2/2008 |
| JP | 2008191015 A | 8/2008 |
| JP | 2015220130 A | 12/2015 |

OTHER PUBLICATIONS

English Translation of the Written Opinion of the International Search Authority in international application No. PCT/CN2017/100486, dated Nov. 28, 2017.
Slowko W Ed—Kok Chi-Wah et al : "Secondary electron detector with a micro-porous plate for environmental SEM", Vacuum, Pergamon Press, GB, vol. 63, No. 4, Jun. 12, 2000 (Jun. 12, 2000), pp. 457-461, XP002268265, ISSN: 0042-207X, DOI: 10.1016/S0042-207X(01 )00221-4 Section 2. Attachable intermediate chamber; figure 1.
Supplementary European Search Report in European application No. 17807687.3, dated Nov. 28, 2018.

* cited by examiner

VACUUM CONDITION PROCESSING APPARATUS, SYSTEM AND METHOD FOR SPECIMEN OBSERVATION

TECHNICAL FIELD

The present disclosure relates to the field of Scanning Electron Microscopes (SEM), and in particular to a vacuum condition processing apparatus, as well as a system and method for specimen observation.

BACKGROUND

The scanning electron microscope (SEM) dates back to the early 1960's, and was invented to help scientists to observe objects or structures of an order of micrometers or nanometers. However, in order to observe a sample by using a conventional SEM, the sample is usually put into a high-vacuum chamber. Therefore, many special treatments to the samples are necessary such as sampling, drying, freezing or gold-plating. There are many objects which are difficult to observe by the conventional SEM, for example: huge samples hard for sampling, aqueous samples, living objects, historic relic and so on.

The invention of environmental scanning electron microscope (ESEM) or variable pressure scanning electron microscope (VP-SEM) is an important breakthrough during the SEM development. To be different from conventional SEM in which the sample should be settled in a high-vacuum chamber (with a typical pressure of less than $10^{-5}$ Torr), the ESEM/VP-SEM allows a gaseous environment with a higher pressure typically between 0.1 Torr and 50 Torr. Due to the gaseous environment and low-vacuum condition, it should say that it presents a significant improvement to the conventional SEM, in sample preparation, the detection scheme, signal processing, and so on. In particular, the samples may be moist samples such as biological samples or non-conductive samples, and the samples do not have to be subjected to special treatment, such as drying, freezing, or vacuum packaging. That is, the ESEM implements in-situ observation of the samples.

However, since all these ESEMs still contain a sample chamber, it is still a problem for huge object observation and frequent sample exchanging during the observation.

Recently a concept of Air-SEM was introduced by B-Nano Company. It was proposed that samples can be directly investigated under the Air-SEM column in the open air. However, since the mean free path of electrons in air is very short, there is a severe limitation to working distance (about tens of microns) and herein the surface morphology of the sample, and a sample which has an uneven surface cannot be observed.

SUMMARY

In view of this, the embodiments of the disclosure provide a vacuum condition processing apparatus, a specimen observation system and method, which can measure specimens with various sizes and various surface topographies, and can provide various detection environments for the specimens to be detected.

The technical schemes of the embodiments of the disclosure is described as follows.

An embodiment of the disclosure provides a vacuum condition processing apparatus, wherein a top of the apparatus is connected to an external particle beam generating device, and the apparatus comprises: a suction cup structure having a bottom in contact with a specimen or a platform holding the specimen, a first gas controlling device connected to an external gas supplying system, a second gas controlling device connected to an external pumping system; wherein a window is deployed at the top of the apparatus, and a particle beam goes into the apparatus through the window; the first gas controlling device is arranged to connect the gas supplying system and the suction cup structure; and the second gas controlling device is arranged to connect the gas supplying system and the suction cup structure.

In an implementation, the suction cup structure comprises: a metal bellow, a spring structure including at least one circle of spring, and a sealing structure; wherein the spring structure is located within the metal bellow, and is arranged to support the metal bellow; a bottom of the metal bellow is connected to the sealing structure; and the sealing structure is in contact with the specimen or the platform holding the specimen.

In an implementation, a gas supplied by the gas supplying system to the apparatus is a pure gas or a mixed gas.

Another embodiment of the disclosure provides a specimen observing system, comprising: a charged particle generating device, a vacuum condition processing device and a specimen; wherein a bottom of a column of the charged particle generating device is fixed to a top of the vacuum condition processing apparatus; the specimen or a platform holding the specimen is in contact with a bottom of the vacuum condition processing apparatus; the vacuum condition processing apparatus comprises: a suction cup structure in contact with the specimen or the platform holding the specimen, a first gas controlling device connected to an external gas supplying system, a second gas controlling device connected to an external pumping system; a window is deployed at a top of the vacuum condition processing apparatus, is located below a first vacuum window at a bottom of the charged particle generating device, and is arranged to allow a charged particle beam generated from the charged particle apparatus and passing through the first vacuum window to impinge the specimen inside the vacuum condition processing apparatus, so as to implement observation of the specimen; the first gas controlling device is connected to the suction cup and the gas supplying system, and is arranged to supply gas to the vacuum condition processing apparatus; and the second gas controlling device is connected to the gas pumping system and the suction cup, and is arranged to pump the vacuum processing apparatus.

In an implementation, the suction cup structure comprises: a metal bellow, a spring structure including at least one circle of spring, and a sealing structure; wherein the spring structure is located within the metal bellow, and is arranged to support the metal bellow; a bottom of the metal bellow is connected to the sealing structure; and the sealing structure is in contact with the specimen or the platform holding the specimen.

In an implementation, a gas supplied by the gas supplying system to the apparatus is a pure gas or a mixed gas.

In an implementation, the system further comprises at least one detector, which is deployed at a top of the vacuum condition processing apparatus horizontally or obliquely, and is arranged to detect a signal generated after the particle beam impinges the specimen.

In an implementation, the system further comprises a magnetic shielding device installed on an outside wall of the column, a bottom of the magnetic shielding device is close to the sealing structure and is arranged to shield the vacuum condition processing apparatus magnetically.

In an implementation, a multi-freedom moving stage is installed on the platform, and is arranged to implement a multi-freedom adjustment of the specimen.

In an implementation, a heating and/or cooling module is installed on the platform and is arranged to adjust an ambient temperature of the specimen.

In an implementation, a scanning transmission device is installed on the platform, a second vacuum window is deployed on an upper surface of a transmission particle detection chamber in the scanning transmission device, and a detector is installed in the transmission particle detection chamber to detect the particle beam after impinging the specimen.

In an implementation, the system further comprises a laser radar module outside the column, wherein the laser radar module is arranged to determine a sucking position of the suction cup structure when the charged particle generating device is being moved.

Another embodiment of the disclosure provides a specimen observation method, applied to the specimen observation system, the method comprising: a charged particle generating device, a vacuum condition processing apparatus and a specimen, wherein the vacuum condition processing apparatus comprises: a suction cup structure in contact with a specimen or a platform holding the specimen, a first gas controlling device connected to an external gas supplying system, a second gas controlling device connected to an external pumping system; wherein the method comprises: creating a local gaseous environment in the vacuum condition processing apparatus by the first gas controlling device and the second gas controlling device, and controlling a pressure of the local gaseous environment by the first gas controlling device and the second gas controlling device; allowing a particle beam generated from the charged particle beam generating apparatus to pass through a first vacuum window at a bottom of a charged particle generating apparatus and impinge the specimen in the vacuum condition processing apparatus, to achieve observation of the specimen.

In an implementation, the controlling the pressure of the local gaseous environment comprises: supplying a gas to the vacuum condition processing apparatus by the gas supplying system via the first gas controlling device, and pumping the vacuum condition processing apparatus by the gas pumping system via the second gas controlling device.

In an implementation, the system further includes at least one detector, which is deployed horizontally or obliquely at a top of the vacuum condition processing apparatus; accordingly, the method further comprises: detecting a signal generated after the particle beam impinges the specimen.

In an implementation, the system further comprises a magnetic shielding device; accordingly, the method further comprises: shielding the vacuum condition processing apparatus magnetically.

In an implementation, a multi-freedom moving stage is installed on the platform; accordingly, the method further comprises: adjusting the specimen at multi-freedom with the multi-freedom moving stage.

In an implementation, a heating and/or cooling module is installed on the platform; accordingly, the method further comprises: adjusting an ambient temperature of the specimen by the heating and/or cooling module.

In an implementation, the scanning transmission device is installed on the platform, a second vacuum window is deployed on an upper surface of a transmission particle detection chamber in the scanning detection device, and a detector is installed in the transmission particle detection chamber; accordingly, the method further comprises: detecting, by using the detector, the charged particle beam after passing through the specimen and the second vacuum window.

In an implementation, the system further comprises a laser radar module outside the column; accordingly, the method further comprises: determining a sucking position of the suction cup structure by the laser radar module when the charged particle generating device is being moved.

In an implementation, the suction cup structure comprises: a metal bellow, a spring structure including at least one circle of spring, and a sealing structure; wherein the spring structure is located within the metal bellow, and is arranged to support the metal bellow; a bottom of the metal bellow is connected to the sealing structure; and the sealing structure is in contact with the specimen or the platform holding the specimen.

In the vacuum condition processing apparatus, the specimen observation system and method provided by the embodiments of the disclosure a top of the apparatus is connected to an external particle beam generating device, and the apparatus comprises: a suction cup structure having a bottom in contact with a specimen or a platform holding the specimen, a first gas controlling device connected to an external gas supplying system, a second gas controlling device connected to an external pumping system; wherein a window is deployed at the top of the apparatus, and a particle beam goes into the apparatus through the window; the first gas controlling device is arranged to connect the gas supplying system and the suction cup structure; and the second gas controlling device is arranged to connect the gas supplying system and the suction cup structure. In this way, the gas supplying system supplies gas to the apparatus via the first gas controlling device and pumps gas from the apparatus via the second gas controlling device, so as to create a formal gaseous environment in the apparatus, and the pressure in the apparatus can be controlled by adjusting the vacuum pump used by the pumping system, pumping speed, and etc., so as to place the specimen in an ideal environment for observation; meanwhile, the bottom of the suction cup is in contact with the specimen to be detected or the platform holding the specimen to be detected to form an area of the specimen to be detected, such that the apparatus can measure specimens with various sizes and various surface topographies.

DETAILED DESCRIPTION OF THE EMBODIMENTS

The details are described as follows with reference to the figures and several embodiments.

Embodiment 1

Figure 1:
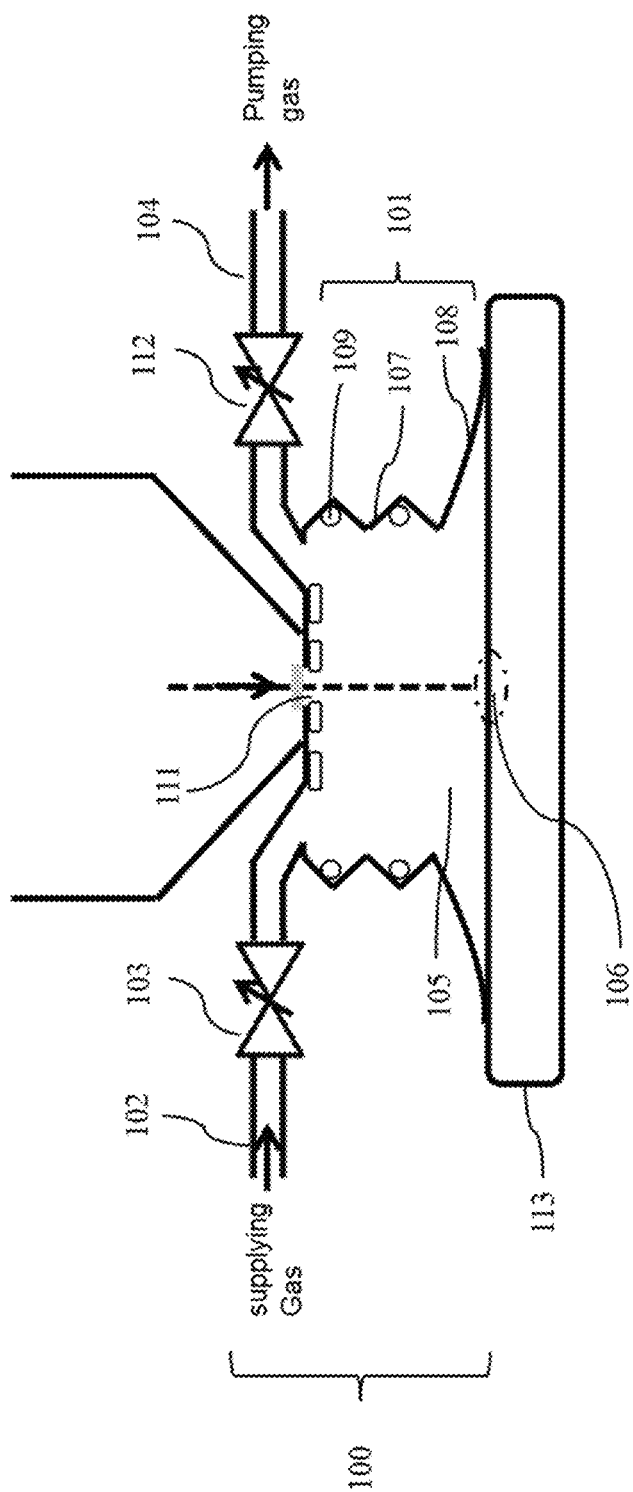
FIG. 1 is a diagram of a sectional view of a vacuum condition processing apparatus, according to embodiment 1 of the disclosure.

A vacuum condition processing apparatus is proposed in embodiment 1 of the disclosure. FIG. 1 is a diagram of a sectional view of the vacuum condition processing apparatus 100. As shown in FIG. 1, the top of the vacuum condition processing apparatus 100 is connected to an external particle generating device; and the vacuum condition processing apparatus 100 comprises: a suction cup structure 101 in contact with a specimen to be detected or a platform holding the specimen, a first gas controlling device 103 connected to an external gas supplying system 102, a second gas controlling device 112 connected to an external pumping system 104.

A window 111 is deployed at the top of the apparatus 100, and through the window 111 the particle beam goes into the apparatus 100.

The first gas controlling device 103 is arranged to connect the gas supplying system 102 and the suction cup structure 101.

The second gas controlling device 112 is arranged to connect the gas pumping system 104 and the suction cup structure 101.

In FIG. 1, the reference sign 113 denotes the specimen to be tested, the reference sign 106 denotes an area of the specimen to be tested.

In one embodiment of the disclosure, each of the first gas controlling device 103 and the second gas controlling device 112 may be an air valve or a channel.

In one embodiment of the disclosure, the vacuum condition processing apparatus 100 may have an axial symmetric structure, such as: a cylinder, a cuboid, or a polygon etc.

In one embodiment of the disclosure, the suction structure 101 can be in contact with the surface of the large specimen or the platform supporting the small specimen, so that the specimen is inside the local space 105.

The suction structure 101 comprises: a metal bellow 107, a sealing structure 108 and a spring structure 109 including at least one circle of spring.

The spring structure is inside the metal bellow to support the metal bellow 107, so that the metal bellow can withstand the pressure difference between the inside and outside of the local space 105.

The bottom of the metal bellow is connected to the sealing structure.

The sealing structure is in contact with the specimen or the platform holding the specimen.

The material of the sealing structure is usually made of soft material, such as silicon rubber, etc.; a local space 105 is created between the sealing structure and the specimen when the sealing structure is brought into contact with the specimen or the platform holding the specimen.

In one embodiment of the disclosure, the supplied gas to the local space 105 via the first gas controlling device 103 from the gas supplying system 102 may be a pure gas or mixed gas; the supplied gas may be $N_2$, He, Ar, $O_2$, and $H_2O$.

In one embodiment of the disclosure, the pressure in the local space 105 can be controlled through controlling the pumping speed of the pump 102 or changing other parameters, therefore, a local space 105 with a variable pressure and gaseous environment is created. In an embodiment of the disclosure, the supplied gas to the local space 105 is Helium. In case that the charged particle is electron, since the mean free path (MFP) of electron in He is large, it applies to specimen observation in low vacuum condition; for example, at atmosphere pressure, the MFP of election with energy of 20 to 30 KeV is about 10 mm.

In an embodiment of the disclosure, the supplied gas is oxygen, the plasma cleaning can be done with the oxygen plasma produced when the electron interacts with the oxygen.

When the local space 105 is filled with gas, the ions produced when the particle interacts with the gas molecule can be used to neutralize the residual charge on the specimen, which helps to improve the imaging quality of the specimen by the charged particle generating device, and especially to improve the image quality of nonconductive specimen by the charged particle generating device; and the charged particle generating device includes: traditional scanning election microscope, environmental scanning electron microscope and other charged particle generating device.

A large specimen chamber is necessary in the conventional scanning electron microscope or environmental scanning electron microscope, one or more pressure limiting apertures are deployed between the column and the specimen chamber; therefore, it usually takes tens of minutes or long to pump the column and specimen chamber of the SEM or ESEM. In one embodiment of the disclosure, the top of the vacuum condition processing apparatus is connected to the first vacuum window at the bottom of column of the charged particle generating device; since the column is pumped and kept at a high vacuum condition before observing, what is needed is only to pump the small local space 105 when performing the specimen observation, and the pumping only takes one minute or shorter time, and the pressure of local space 105 can vary from one atm to $10^{-6}$ Torr.

Figure 2A:
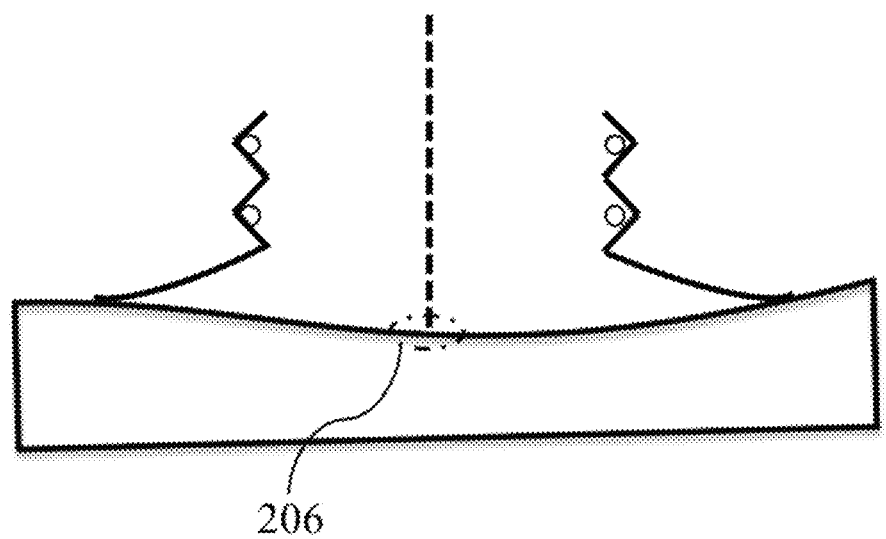
FIG. 2A is a diagram of a suction structure in contact with a specimen with a concave surface, according to an embodiment of the disclosure.
Figure 2B:
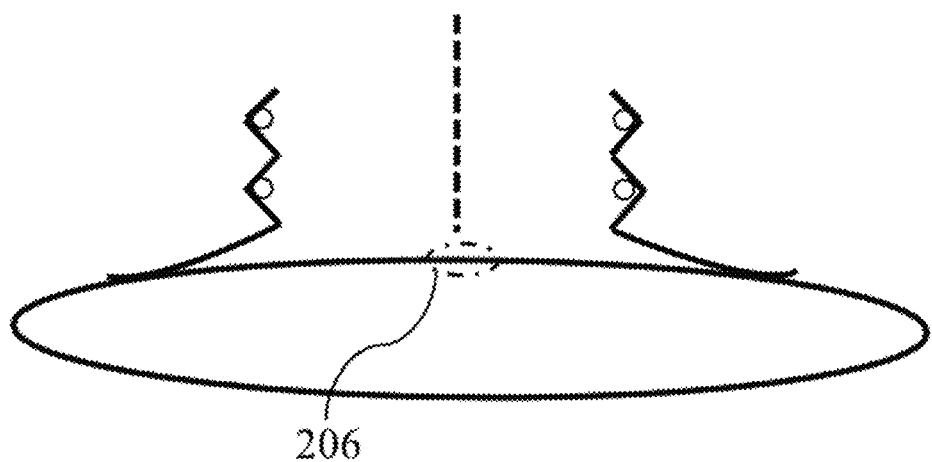
FIG. 2B is a diagram of a suction structure in contact with a specimen with a convex surface, according to an embodiment of the disclosure.
Figure 2C:
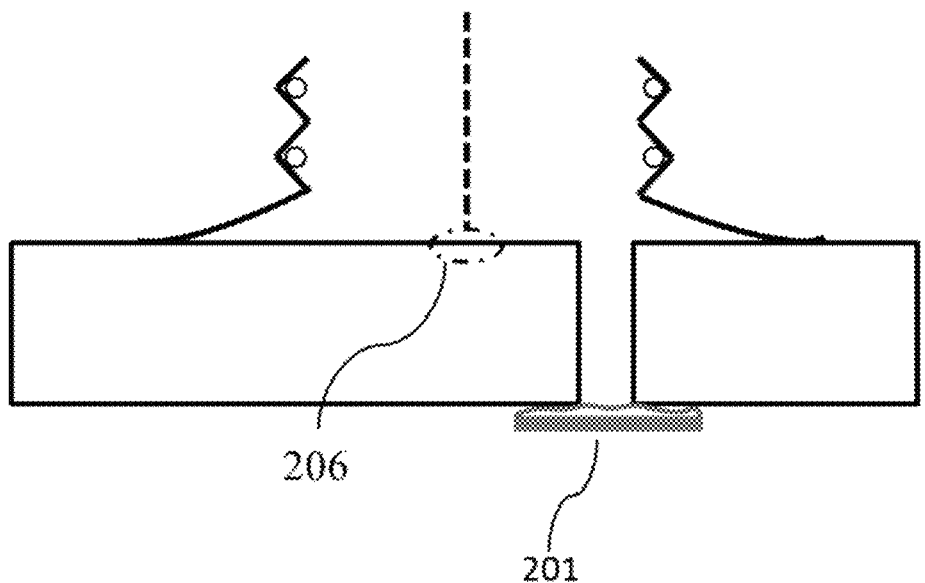
FIG. 2C is a diagram of a suction structure in contact with a specimen with a hole on the surface, according to an embodiment of the disclosure.
Figure 2D:
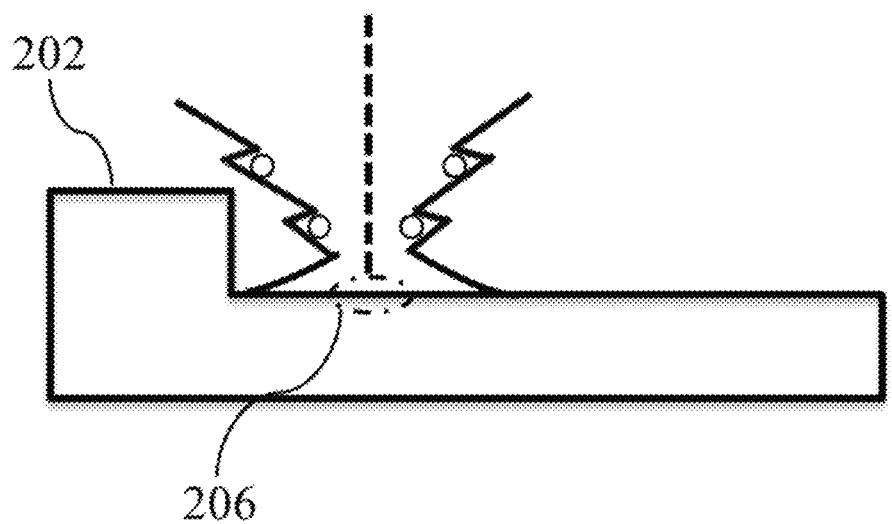
FIG. 2D is a diagram of a suction structure in contact with a specimen with a sidestep shape surface, according to an embodiment of the disclosure.

In an embodiment of the disclosure, the suction structure 101 of the vacuum condition processing apparatus 100 is adaptable to surface topography of the specimens of several kinds, and the shape of the metal bellow 107 can be varied with the surface topography of the specimen. FIG. 2 is a diagram of the suction structure 101 in contact with the specimen surface, the reference sign 206 denotes the area of the specimen to be tested. FIG. 2A is a diagram of the suction structure 101 in contact with a specimen with a concave surface; FIG. 2B is a diagram of the suction structure 101 in contact with a specimen with a convex surface; FIG. 2C is a diagram of the suction structure 101 in contact with a specimen with a hole, in which a sealing member 201 is arranged to seal the local space at the other side of the specimen, the sealing member 201 is made up of a supporting structure with a high hardness and a flexible structure with high leakproofness; FIG. 2D shows a specimen with a step structure 202 near the area 206 to be tested, and at this time, the sealing structure 201 is redesigned to adapt this special specimen.

Embodiment 2

Figure 3:
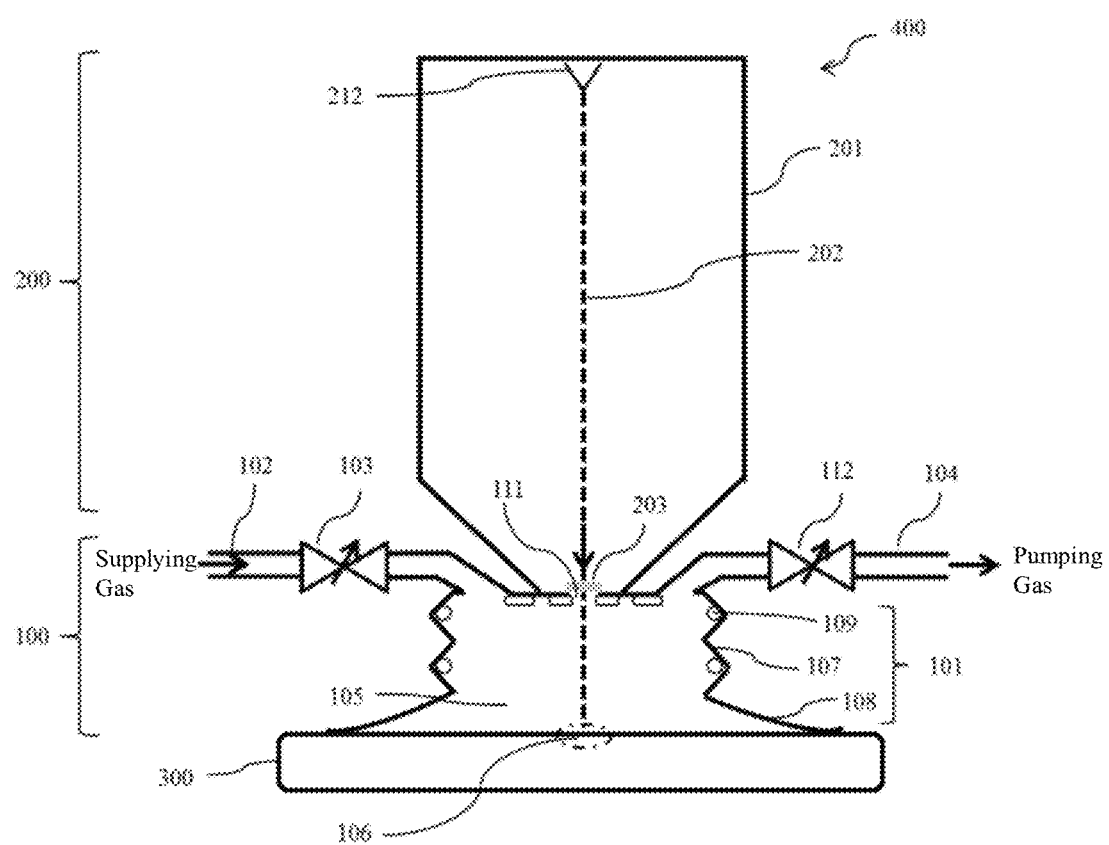
FIG. 3 is a diagram of a sectional view of a specimen observation system, according to embodiment 2 of the disclosure.

A specimen observation system 400 is proposed in embodiment 2 of the disclosure, and FIG. 3 is a diagram of the sectional structure of the system comprising: a vacuum condition processing apparatus 100, a charged particle beam generating device 200 and the specimen 300; wherein the bottom of the column 201 of the charged particle generating device 200 is connected to the top of the vacuum condition processing apparatus 100 fixedly.

The specimen 300 or the platform holding the specimen 300 is brought into contact with the bottom of the vacuum condition processing apparatus.

The vacuum condition processing apparatus 100 comprises: the suction structure 101 in contact with the specimen or the platform holding the specimen, the first gas controlling device 103 connected to the external gas supplying system 102 and the second gas controlling device connected to the external pumping system 112.

A window 111 is deployed at the top of the vacuum condition processing apparatus 100, the window 111 is below the first vacuum window 203 at the bottom of the charged particle generating apparatus 200, and is arranged to allow the charged particle beam 202 generated by particle source 212 inside the charged particle generating apparatus to pass through the vacuum window 203, and to enter the vacuum condition processing apparatus 100 and observe the specimen 300.

The first gas controlling device 103 is arranged to connect the gas supplying system 102 and the suction structure 101 and to supply gas to the vacuum condition processing apparatus 100.

The second gas controlling device 112 is arranged to connect the pumping system 104 and the suction structure 101 and to pump the vacuum condition processing apparatus 100.

In one embodiment of the disclosure, the first gas controlling device 103 and the second gas controlling device 112 may be a gas valve or a channel.

In one embodiment of the disclosure, the vacuum condition processing apparatus 100 may be an axial symmetric structure, such as: a cylinder, a cuboid, or a polygon etc.

In one embodiment of the disclosure, the suction structure 101 can be in contact with the surface of the large specimen or the platform supporting the small specimen, so that the specimen is inside the local space 105.

The suction structure 101 comprises: a metal bellow 107, a sealing structure 108 and a spring structure 109 including at least one circle of spring.

The spring structure is inside the metal bellow to support the metal bellow 107, so that the metal bellow can withstand the pressure difference between inside and outside of the metal bellow 107.

The bottom of the metal bellow is connected to the sealing structure.

The sealing structure is brought into contact with the specimen or the platform holding the specimen.

The sealing structure is usually made of soft material, such as silicon rubber, etc.; a local space 105 is created between the sealing structure and the specimen when the sealing structure is brought into contact with the specimen or the platform holding the specimen.

In one embodiment of the disclosure, the supplied gas to the local space 105 via the first gas controlling device 103 from the gas supplying system 102 may be a pure gas or mixed gas; the supplied gas may include but is not limited to $N_2$, He, Ar, $O_2$, and $H_2O$.

In one embodiment of the disclosure, the pressure in the local space 105 can be changed through controlling the pumping speed of the pump 102 or other parameters. Therefore, a local space 105 with a variable pressure and a variable gaseous environment is created.

In an embodiment of the disclosure, the supplied gas to the local space 105 is Helium, in case that the charged particle is electron, since the mean free path (MFP) of electron in He is large, it applies to specimen observation in low vacuum condition; for example, at atmosphere pressure, the MFP of election with energy of 20 to 30 KeV is about 10 mm.

In an embodiment of the disclosure, the supplied gas is oxygen, the plasma cleaning can be done with the oxygen plasma produced when the electron interacts with the oxygen.

When the local space 105 is filled with gas, the ions produced when the particle interacts with the gas molecule can be used to neutralize the residual charge on the specimen, which helps to improve the imaging quality of the specimen by the charged particle generating device, and especially to improve the image quality of nonconductive specimen by the charged particle generating device; and the charged particle generating device includes: traditional scanning election microscope, environmental scanning electron microscope and other charged particle generating device.

A large specimen chamber is necessary in the conventional scanning electron microscope or environmental scanning electron microscope, one or more pressure limiting apertures are deployed between the column and the specimen chamber; therefore, it usually takes tens of minutes or long to pump the column and specimen chamber of the SEM or ESEM. In one embodiment of the disclosure, the top of the vacuum condition processing apparatus is connected to the first vacuum window at the bottom of column of the charged particle generating device; since the column is pumped and kept at a high vacuum before observing, what is needed is only to pump the small local space 105 when performing the specimen observation, and the pumping only takes one minute or shorter time, and the pressure of local space 105 can vary from one atm to $10^{-6}$ Torr.

In an embodiment of the disclosure, the suction structure 101 of the vacuum condition processing apparatus 100 is adaptable to surface topography of the specimens of several kinds, and the shape of the metal bellow 107 can be varied with the surface topography of the specimen. FIG. 2 is a diagram of the suction structure 101 in contact with the specimen surface, the reference sign 206 denotes the area of the specimen to be tested. FIG. 2A is a diagram of the suction structure 101 in contact with a specimen with a concave surface; FIG. 2B is a diagram of the suction structure 101 in contact with a specimen with a convex surface; FIG. 2C is a diagram of the suction structure 101 in contact with a specimen with a hole, in which a sealing member 201 is arranged to seal the local space at the other side of the specimen, the sealing member 201 is made up of a supporting structure with a high hardness and a flexible structure with high sealness; FIG. 2D shows a specimen with a step structure 202 near the area 206 to be tested, and at this time, the sealing structure 201 is redesigned to adapt this special specimen.

In this embodiment of the disclosure, the particle source 212 in the charged particle generating device 200 generates a charged particle beam, and the particle beam is accelerated, deflected and focused by the acceleration electrode, deflection device, and the objective lens; a first vacuum window 203 sealed with a membrane is deployed at the bottom of the column 201, the material of the first window may be $Si_xN_y$, $SiO_2$, or graphene membrane, the size and shape of the first vacuum window 203 may vary accordingly; the first vacuum window 203 has the following functions: one is allowing the particles 202 to pass through the first vacuum window 203 with the least scattering; the other one is that when the column 201 is sealed with the membrane on the first vacuum window 203, the column 201 can be kept at a high vacuum, so that the vacuum controlling system for controlling the column 201 can be simplified, and the column 201 can be easily installed on the mechanical arm or the gantry-type structure.

Figure 4:
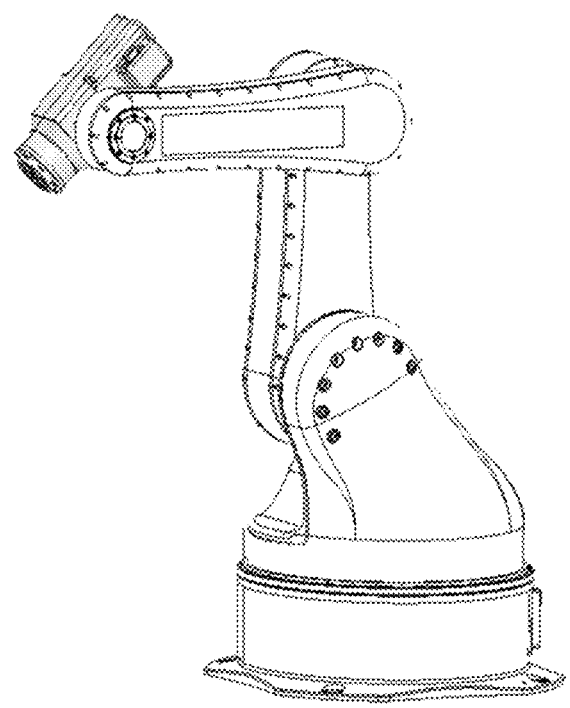
FIG. 4 is a diagram of a mechanical arm, according to an embodiment of the disclosure.
Figure 5:
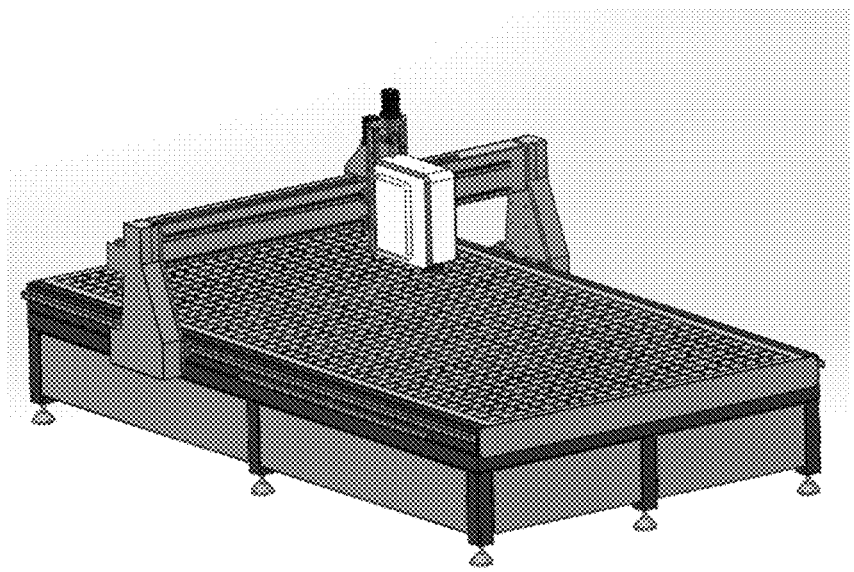
FIG. 5 is a diagram of a gantry-type structure, according to an embodiment of the disclosure.

Specifically, FIG. 4 is a diagram of a mechanical arm, and FIG. 5 is a diagram of gantry-type structure.

The charged particle generating device 200 may be the traditional scanning electron microscope, the environmental scanning electron microscope or other charged particle device.

Embodiment 3

In embodiment 3, a multi-freedom stage is added to the specimen observation system based on that in embodiment 2, and the stage is arranged to perform multi-freedom adjustment on the specimen.

Figure 6A:
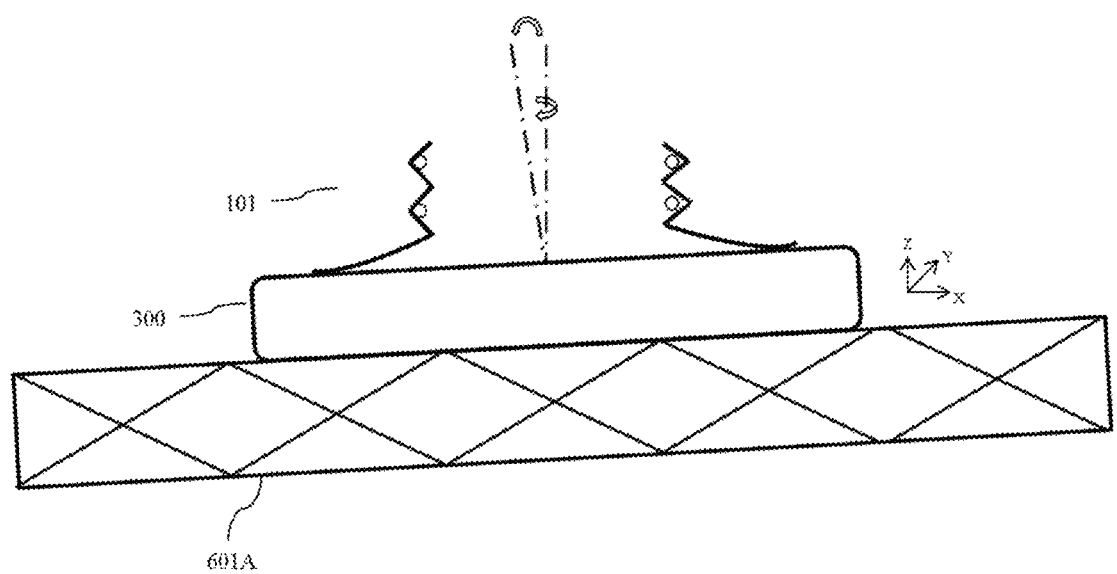
FIG. 6A is a diagram of the adjustment of large size specimen with a multi-freedom stage.

Specifically, a specimen may be defined to be a "large specimen" if the size of the upper surface of the specimen is larger than the suction cup structure. FIG. 6A is a diagram of adjustment of the specimen with a multi-freedom stage; the specimen 300 is fixed on a stage 601, the surface of the specimen to be observed acts as a sealing surface against suction cup 101. Before the suction cup 101 is brought into contact with the specimen 300, one can adjust the position of the specimen with the multi-freedom stage; after the suction cup 101 is brought into contact with the specimen 300, one can also slightly adjust the position of the specimen 300 via the deformation of the suction cup, to achieve better observation of the specimen 300. For a large specimen hard to move, the charged particle device according to the invention can be installed on the mechanical arm or the gantry-type structure, so that the charged particle device can be moved with the mechanical arm or the gantry-type structure to achieve the observation of the large specimen.

The multi-freedom stage may be one or more mechanical or piezo stages, the adjustment of the position of the specimen 300 is shown in FIG. 6A, which comprises: translation along X, Y, Z, tilt and rotation.

Figure 6B:
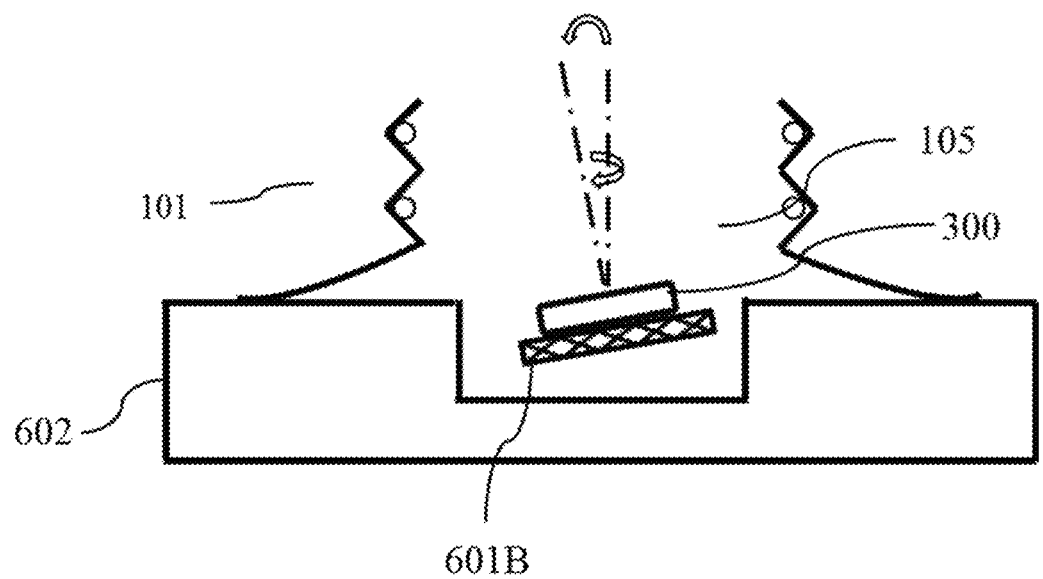
FIG. 6B is a diagram of the adjustment of small size specimen with a multi-freedom stage.

A specimen may be defined to be a "small specimen" if the radial size of the upper surface of the specimen is smaller than that of the suction cup structure. As shown in FIG. 6B, the specimen 300 should be placed on a multifunctional stage 602, the suction cup 101 is in contact with the upper surface of stage 602 and an enclosed space 105 is created therebetween; a multi-freedom stage 601B is installed on the multifunctional stage 602, the specimen 300 is placed on the stage 601B, with which the specimen can be adjusted.

The multi-freedom stage may be one or more mechanical or piezo stages, the adjustment of the position of the specimen 300 is shown in FIG. 6A, which comprises: translation along X, Y, Z, tilt and rotation.

For a small and ultrathin specimen, the scanning transmission image can also be taken by using a multifunctional working stage 700 with a scanning transmission detection chamber. And the charged particle beam generating device 200 can act as a scanning transmission particle microscope; the upper surface of the working stage 700 is brought into contact with the suction cup 101 to form a sealed chamber 105, the ultrathin specimen 300 is placed on a moving stage of the chamber 105; the working stage 700 also includes a transmission particle detection chamber 705, a second vacuum window 701 is deployed at the top of the detection chamber 705, the second vacuum window 701 has the following functions: firstly, it allows the particle beam to pass through the ultrathin specimen to enter the chamber 705 with the least scattering; secondly, it seals the detection chamber 705. The bottom of the detection chamber 705 is connected to an external pumping system through a third gas controlling device 706 to pump the chamber 705; two transmission particle detectors 702 and 703 are deployed in the detection chamber 705 to achieve the scanning transmission imaging of the ultrathin specimen.

The material of the second window may be $Si_xN_y$, $SiO_2$, or graphene film, the shape and size of the second vacuum window 701 can vary accordingly. Both the transmission particle detection chamber 705 and the local space 105 are at high vacuum condition in order to reduce particle scattering.

Figure 7:
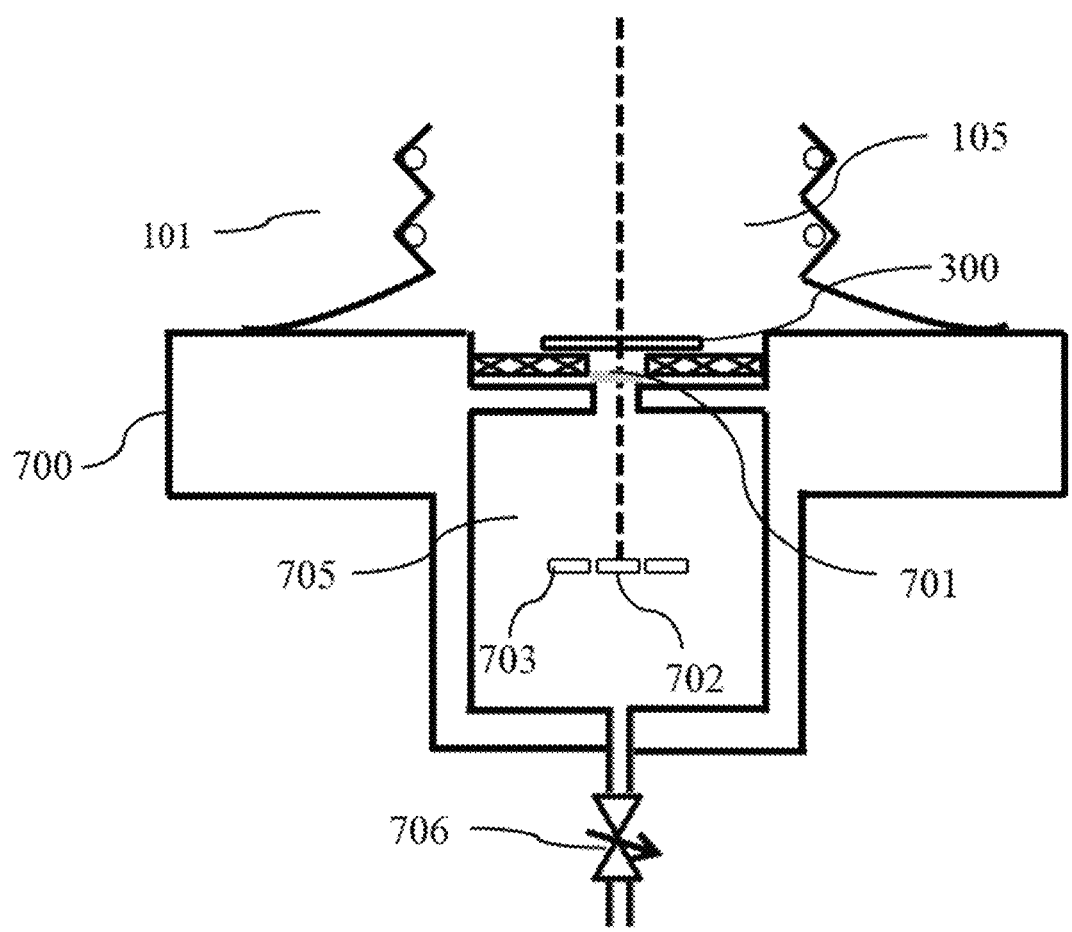
FIG. 7 is a diagram of scanning transmission device, according to an embodiment of the disclosure.

In one embodiment of the disclosure, a heating or cooling module can be installed on the stage in FIG. 6B and FIG. 7 to adjust the ambient temperature of the specimen.

The heating module may be implemented by an electrical heating plate, the cooling module may be implemented by a liquid nitrogen pool.

Therefore, the specimen with any surface size can be observed.

Since the specimen observation system in embodiment 3 is proposed based on that in embodiment 2, all the features of the specimen observation system in embodiment 2 apply to embodiment 3.

Embodiment 4

Based on the specimen observation systems in embodiment 2 and embodiment 3, another specimen observation system is proposed in embodiment 4, in which at least one detector is added to the system, the detector is installed horizontally or tilted, according to the type thereof, at the top of the vacuum condition processing apparatus, to detect the signal generated when the particle beam interacts with the specimen;

The detector may comprise but is not limited to: backscattered particle detector, secondary particle detector, gas detector, energy dispersion detector, and cathodoluminescence detector (CL).

Figure 8:
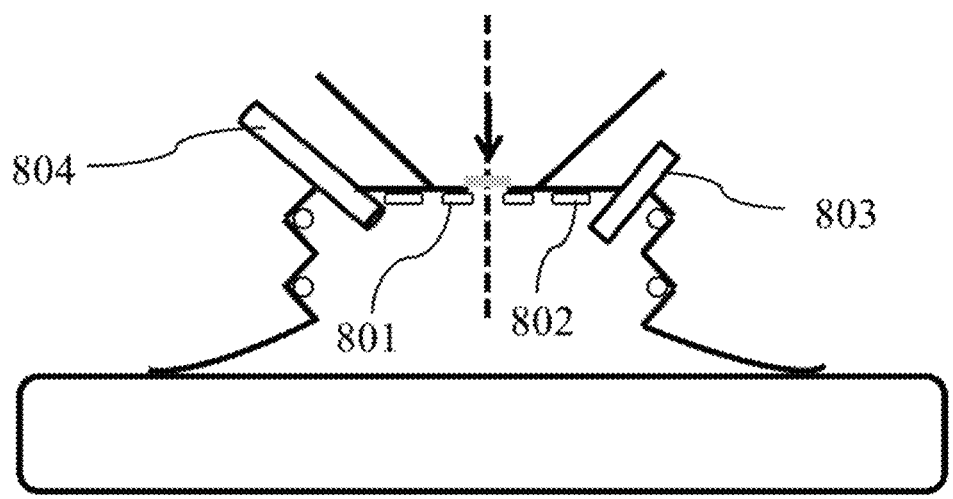
FIG. 8 is a diagram of detector deployment, according to an embodiment of the disclosure.

FIG. 8 is a diagram of the detector deployment, according to this embodiment of the disclosure. As shown in FIG. 8 the backscattered particle detector 801 and the gas detector 802 are deployed at the top of the vacuum condition processing apparatus 1, and the secondary particle detector and the energy dispersion detector are deployed symmetrically with a specific angle at the top of the vacuum condition processing apparatus 1.

Since the specimen observation system in embodiment 4 is based on that in embodiment 2 or 3, all the features of the specimen observation system in embodiment 2 or 3 apply to that in embodiment 4.

Embodiment 5

Based on the specimen observation system in embodiment 2, embodiment 3 and embodiment 4 of the disclosure, another specimen observation system is proposed in embodiment 5 of the disclosure. The specimen observation system further comprises a magnetic shielding device shown in FIG. 9, the magnetic shielding device is installed on the outside wall of the column 201, and the bottom of the device is close to the sealing structure, and the suction cup 100 is surrounded by the device, and the device can be moved up and down; when moving the specimen 300, the magnetic shielding device can also be moved up and down to isolate the suction cup 100 by active or passive magnetic shielding.

Since the specimen observation system in embodiment 5 is based on that in embodiment 2, 3 and 4, all the features of the specimen observation system in embodiment 2 or 3 or 4 apply to embodiment 5.

Embodiment 6

Based on the specimen observation system in embodiment 2, embodiment 3, embodiment 4 and embodiment 5 of the disclosure, another specimen observation system is proposed in embodiment 6 of the disclosure. The specimen observation system further comprises a laser radar module shown in FIG. 9. The laser radar module 901 is installed outside the column. When the charged particle beam device 200 is moved by the mechanical arm or the gantry-type structure, the laser radar module 901 is arranged to determine the position of the specimen 300, so that the vacuum condition processing apparatus 100 can go to the right position and the collision with the specimen can be avoided.

Since the specimen observation system in embodiment 6 is based on that in embodiment 2, 3, 4 and 5, all the features of the specimen observation system in embodiment 2, 3, 4 or 5 apply to embodiment 6.

Embodiment 7

Figure 10:
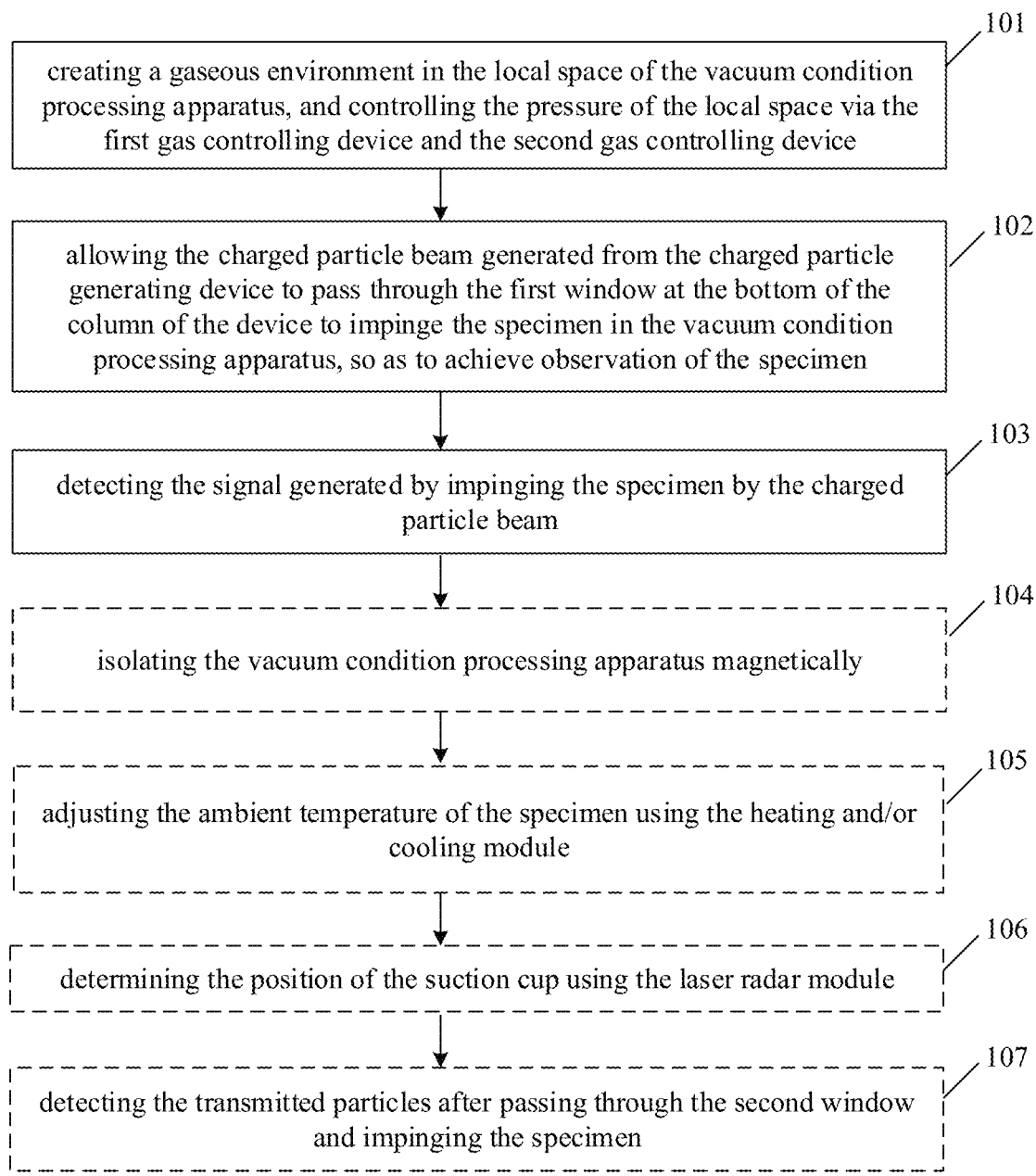
FIG. 10 is a flowchart of the specimen observation, according to embodiment 7 of the disclosure.

According to the vacuum condition processing apparatus and the specimen observation system in the aforementioned embodiments of the disclosure, a specimen observation method is disclosed in embodiment 7, and the method applies to any specimen observation system in embodiments 2 to 7. FIG. 10 is the flowchart of the specimen observation method according to the method, and the process comprises the following steps.

In Step 101, a local gaseous environment is created in the local space of the vacuum condition processing apparatus via the first gas controlling device and the second gas controlling device, and the pressure of the local space is controlled via the first gas controlling device and the second gas controlling device;

Specifically, the suction cup of the vacuum condition processing apparatus is attached to the surface of the specimen or the stage holding the specimen to form a sealed space; and then the gas is supplied to the vacuum condition processing apparatus by the gas supplying system via the first gas controlling device, and the vacuum condition processing apparatus is pumped by the pumping system via the second gas controlling device, and therefore a local gaseous environment is created at the local space; the pressure of the local gaseous environment is controlled by using different pumps or adjusting the pumping speed.

The gas supplied by the gas supplying system may be pure gas or mixed gas; the gas may include but be not limited to: He, Ar, $N_2$, $H_2O$, $O_2$, etc.;

The suction cup of the vacuum condition processing apparatus is attached to the surface of the specimen or the surface of the stage holding the specimen, the specific implementation process of which is as follows: firstly, determining the position of the specimen with the laser radar module; and then moving the charged particle generating device by the mechanical arm of gantry-type structure to be close to the specimen or the stage holding the specimen; and finally the suction cup of the vacuum condition processing apparatus is attached to the surface of the specimen or the surface of the stage holding the specimen. At this time, the position of the specimen may be adjusted with the moving stage at multi-freedom to ensure that the particle beam can accurately impinge the position to be detected on the specimen.

In a preferred embodiment of the disclosure, the supplied gas is Helium, in case that the charged particle is electron, since the mean free path (MFP) of electron in He is large, it applies to specimen observation in low vacuum condition; for example, at the atmosphere pressure, the MFP of election with energy of 20 to 30 KeV is about 10 mm in He.

In one embodiment of the disclosure, the supplied gas is oxygen, and the plasma cleaning can be done with the oxygen plasma produced when the electron interacts with the oxygen molecules.

When the local space 105 is filled with gas, the ions produced when the particle interacts with the gas molecule can be used to neutralize the residual charge on the specimen, which helps to improve the imaging quality of the specimen by the charged particle generating device, and especially to improve the image quality of nonconductive specimen by the charged particle generating device; and the charged particle generating device includes: traditional scanning election microscope, environmental scanning electron microscope and other charged particle generating device.

A large specimen chamber is necessary in conventional scanning electron microscope or environmental scanning electron microscope, one or more pressure limiting aperture is deployed between the column and the specimen chamber; therefore it usually takes tens of minutes or long to pump the column and specimen chamber of the SEM or ESEM. In one embodiment of the disclosure, the top of the vacuum condition processing apparatus connects to the first window at the bottom of column of the charged particle generating device; since the column is pumped and kept at a high vacuum before observing, what one need is only to pump the small local space 105 when do the observation, and the pumping only takes several minutes or shorter time, and the pressure of local space 105 can vary from one atm to $10^{-6}$ Torr.

In Step 102: the charged particle beam generated from the charged particle generating device passes through the first vacuum window at the bottom of the column of the device to impinge the specimen in the vacuum condition processing apparatus, and achieve the observation of the specimen.

In a preferred embodiment of the disclosure, the specimen observation system includes at least one detector, the detector is deployed horizontally or tilted at the top of the vacuum condition processing apparatus; accordingly the method further comprises:

In Step 103: a signal generated from the impingement of the particle beam on the specimen is detected.

Here, the detector may include but be not limited to: backscattered particle detector, secondary particle detector, gas detector, energy dispersion detector, and cathodoluminescence detector (CL).

The detectors are deployed horizontally or tilted, according to their respective kinds, at the top of the vacuum condition processing apparatus to detect the signal generated from the impingement of the particle beam on the specimen.

FIG. 8 is a diagram of the detector deployment, according to this embodiment of the disclosure, the backscattered particle detector and the gas detector are deployed at the top of the vacuum condition processing apparatus, and the secondary particle detector and the energy dispersion detector 804 are deployed symmetrically with a specific angle at the top of the vacuum condition processing apparatus.

In a preferred embodiment of the disclosure, the specimen observation system further comprises a magnetic shielding device; accordingly, the method further comprises the following step.

In Step 104: the vacuum condition processing apparatus is isolated magnetically.

Specifically, as shown in FIG. 8, the magnetic shielding device is installed on the outside wall of the column, and the bottom of the magnetic shielding device is close to the sealing structure, and the suction cup is surrounded by the device, and the device can be moved up and down; when moving the specimen, the magnetic shielding device can be moved up and down to isolate the vacuum condition processing apparatus by active or passive magnetic shielding.

In a preferred embodiment of the disclosure, the specimen observation system further comprises a heating and/or cooling module; accordingly, the method further comprises the following step.

In Step 105: the ambient temperature of the specimen is adjusted by the heating or cooling module.

The heating or cooling module is installed on the multifunctional working stage.

The heating module may be implemented by an electrical heating plate. The cooling module may be implemented by a liquid nitrogen pool.

In a preferred embodiment of the disclosure, the specimen observation system further comprises a laser radar module; accordingly, when changing the position to be detected on the specimen, the method further comprises the following step.

In Step 106: the position of the specimen is determined using the laser radar module.

Figure 9:
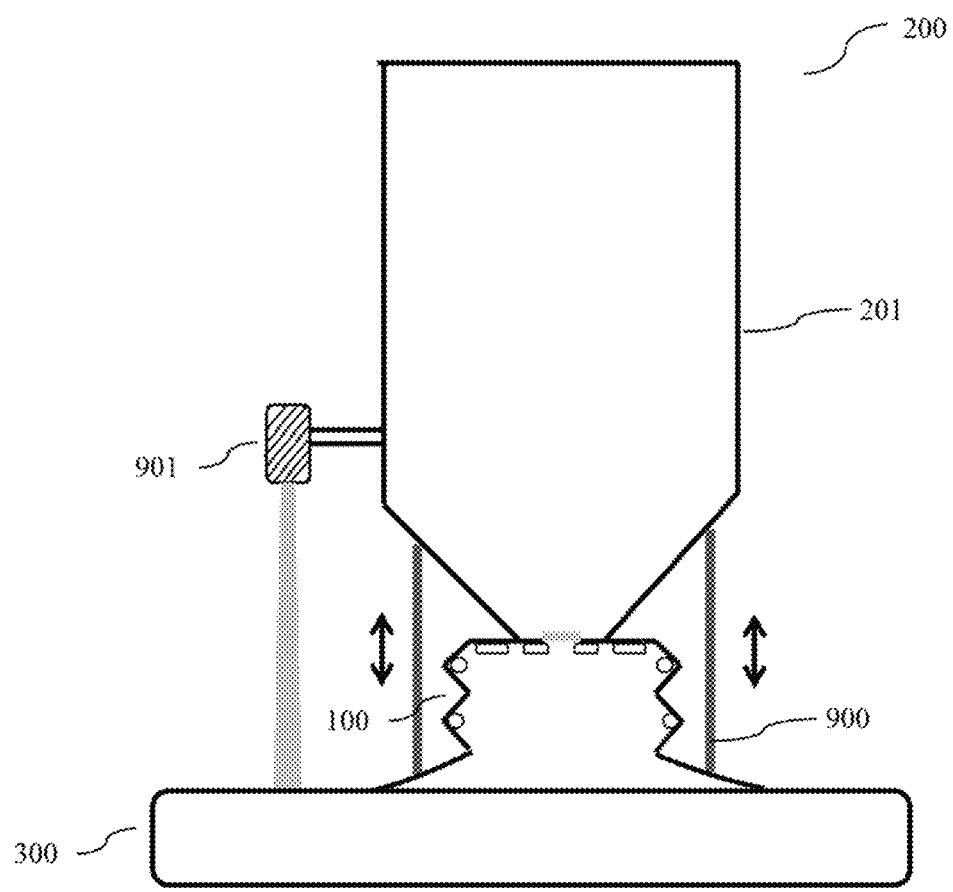
FIG. 9 is a diagram of the deployment of the magnetic shielding device and the laser radar module, according to an embodiment of the disclosure.

Specifically, as shown in FIG. 9, the laser radar module is installed outside the column, when the charged particle beam device is moved by the mechanical arm or the gantry-type structure, the laser radar module is arranged to determine the position of the specimen, so that the vacuum condition processing apparatus can go to the right position and that the collision with the specimen can be avoided.

In the embodiments of the disclosure, a specimen is defined to be a "large specimen" if the radial size of the upper surface of the specimen is larger than that of the suction cup structure. For a large specimen, its surface acts as a sealing plane against the suction cup. Before the suction cup is attached to the specimen, one can adjust the position of the specimen with the multi-freedom moving stage; after the suction cup is attached to the specimen, one can also slightly adjust the position of the specimen by means of the deformation of the suction cup, to achieve better observation of the specimen. For the large specimen hard to move, the charged particle device can be installed on the mechanical arm or the gantry-type structure, and the charged particle generating device is moved with the mechanical arm or the gantry-type structure to achieve the observation of large and immovable specimen.

The adjustment of the position of the specimen with the multi-freedom moving stage comprises: translation along X, Y, Z, tilt and rotation.

A specimen is defined to be a "small specimen" if the size of the upper surface of the specimen is smaller than that of the suction cup structure. The specimen should be placed on a multifunctional stage shown in FIG. 6B, the suction cup is brought into contact with the upper surface of working stage to form a sealed space; and using a multi-freedom moving stage to accurately adjust the specimen.

For a small and ultrathin specimen, the specimen observation system further comprises a scanning transmission device, the scanning transmission device is installed on the working stage; in this case, the charged particle beam generating device can act as a scanning transmission particle microscope as shown in FIG. 7; a transmission particle detection chamber 705 is deployed in the working stage, a second vacuum window 701 is installed at the upper surface of the transmission particle detection chamber 705, and accordingly, the method further comprises:

In Step 107: the particle beam after passing through the second vacuum window and impinging the specimen is detected.

It is to be noted that: Step 103 to Step 107 in embodiment 7 of the disclosure can be performed in any order or concurrently. In practical application, the method may include any one or more of Step 103 to Step 107 of the embodiment; the charged particle beam generating device in the aforementioned embodiments may be traditional scanning electron microscope, environmental scanning electron microscope or other charged particle beam devices.

What described are merely embodiments of the disclosure, and not intended to limit the scope of protection of the disclosure.

INDUSTRIAL APPLICABILITY

With the vacuum condition processing apparatus, as well as the system and method for specimen observation according to the disclosure, a local gaseous environment is created between the suction cup and the specimen, and specimen with any size can be observed with the disclosed system and method. The pressure and gas in the detection area can be controlled by the pumping system and the gas supplying system. A scanning transmission detection module can be installed on the multifunctional working stage to achieve the scanning transmission detection of the specimen. A magnetic shielding device and a laser radar device can also be equipped on the system, therefore isolating the vacuum condition processing device can be achieved to get the better image without the stray magnetic field disturbance; and the laser radar device can help to find the right position of the specimen when moving the charged particle beam system by the mechanical arm or the gantry type device.

The invention claimed is:

1. A vacuum condition processing apparatus, wherein a top of the apparatus is connected to an external particle beam generating device, and the apparatus comprises:
   a suction cup structure having a bottom in contact with a specimen or a platform holding the specimen, a first gas controlling device connected to an external gas supplying system, a second gas controlling device connected to an external pumping system; wherein
the suction cup structure comprises: a metal bellow, a spring structure including at least one circle of spring, and a sealing structure; wherein
the spring structure is located within corrugations of the metal bellow, and is arranged to support the metal bellow; a bottom of the metal bellow is connected to the sealing structure; and the sealing structure is in contact with the specimen or the platform holding the specimen;
a window is deployed at the top of the apparatus, and a particle beam goes into the apparatus through the window;
the first gas controlling device is arranged to connect the gas supplying system and the suction cup structure; and
the second gas controlling device is arranged to connect the gas pumping system and the suction cup structure.

2. The apparatus according to claim 1, wherein the first gas controlling system is further arranged to supply a pure gas or a mixed gas to the apparatus.

3. A specimen observing system, comprising: a charged particle generating device, a vacuum condition processing apparatus and a specimen; wherein
a bottom of a column of the charged particle generating device is fixed to a top of the vacuum condition processing apparatus;
the specimen or a platform holding the specimen is in contact with a bottom of the vacuum condition processing apparatus;
the vacuum condition processing apparatus comprises: a suction cup structure in contact with the specimen or the platform holding the specimen, a first gas controlling device connected to an external gas supplying system, a second gas controlling device connected to an external pumping system, wherein the suction cup structure comprises:
a metal bellow, a spring structure including at least one circle of spring, and a sealing structure, wherein
the spring structure is located within corrugations of the metal bellow, and is arranged to support the metal bellow;
a bottom of the metal bellow is connected to the sealing structure; and
the sealing structure is in contact with the specimen or the platform holding the specimen;
a window is deployed at a top of the vacuum condition processing apparatus, is located below a first vacuum window at a bottom of the charged particle generating device, and is arranged to allow a charged particle beam generated from the charged particle apparatus and passing through the first vacuum window to impinge the specimen inside the vacuum condition processing apparatus, so as to implement observation of the specimen;
the first gas controlling device is connected to the suction cup and the gas supplying system, and is arranged to supply gas to the vacuum condition processing apparatus; and
the second gas controlling device is connected to the gas pumping system and the suction cup is arranged to pump the vacuum condition processing apparatus.

4. The system according to claim 3, wherein the first gas controlling system is further arranged to supply a pure gas or a mixed gas to the apparatus.

5. The system according to claim 3, wherein the system further comprises at least one detector, which is deployed at a top of the vacuum condition processing apparatus horizontally or obliquely, and is arranged to detect a signal generated after the particle beam impinges the specimen.

6. The system according to claim 3, wherein the system further comprises a magnetic shielding device installed on an outside wall of the column, a bottom of the magnetic shielding device is close to the sealing structure and is arranged to shield the vacuum condition processing apparatus magnetically.

7. The system according to claim 3, wherein a multi-freedom moving stage is installed on the platform, and is arranged to implement a multi-freedom adjustment of the specimen.

8. The system according to claim 3, wherein a heating and/or cooling module is installed on the platform and is arranged to adjust an ambient temperature of the specimen.

9. The system according to claim 3 wherein a scanning transmission device is installed on the platform, a second vacuum window is deployed on an upper surface of a transmission particle detection chamber in the scanning transmission device, and a detector is installed in the transmission particle detection chamber to detect the particle beam after impinging the specimen.

10. The system according to claim 3, wherein the system further comprises a laser radar module outside the column, wherein the laser radar module is arranged to determine a sucking position of the suction cup structure when the charged particle generating device is being moved.

11. A specimen observation method, applied to the specimen observation system, the system comprising: a charged particle generating device, a vacuum condition processing apparatus and a specimen, wherein the vacuum condition processing apparatus comprises: a suction cup structure in contact with a specimen or a platform holding the specimen, a first gas controlling device connected to an external gas supplying system, a second gas controlling device connected to an external pumping system, wherein the suction cup structure comprises: a metal bellow, a spring structure including at least one circle of spring, and a sealing structure, wherein
the spring structure is located within corrugations of the metal bellow, and is arranged to support the metal bellow;
a bottom of the metal bellow is connected to the sealing structure; and
the sealing structure is in contact with the specimen or the platform holding the specimen;
wherein the method comprises:
creating a local gaseous environment in the vacuum condition processing apparatus by the first gas controlling device and the second gas controlling device, and controlling a pressure of the local gaseous environment by the first gas controlling device and the second gas controlling device;
allowing a particle beam generated from the charged particle beam generating apparatus to pass through a first vacuum window at a bottom of a charged particle generating apparatus and impinge the specimen in the vacuum condition processing apparatus, to achieve observation of the specimen.

12. The method according to claim 11, wherein the controlling the pressure of the local gaseous environment comprises:
supplying a gas to the vacuum condition processing apparatus by the gas supplying system via the first gas controlling device, and pumping the vacuum condition processing apparatus by the gas pumping system via the second gas controlling device.

13. The method according to claim 11, wherein the system further includes at least one detector, which is deployed horizontally or obliquely at a top of the vacuum condition processing apparatus; accordingly, the method further comprises:

detecting a signal generated after the particle beam impinges the specimen.

14. The method according to claim 11, wherein the system further comprise a magnetic shielding device; accordingly, the method further comprises:

shielding the vacuum condition processing apparatus magnetically.

15. The method according to claim 11, wherein a multi-freedom moving stage is installed on the platform; accordingly, the method further comprises:

adjusting the specimen at multi-freedom with the multi-freedom moving stage.

16. The method according to claim 11, wherein a heating and/or cooling module is installed on the platform; accordingly, the method further comprises:

adjusting an ambient temperature of the specimen by the heating and/or cooling module.

17. The method according to claim 11, wherein the scanning transmission device is installed on the platform, a second vacuum window is deployed on an upper surface of a transmission particle detection chamber in the scanning detection device, and a detector is installed in the transmission particle detection chamber; accordingly, the method further comprises:

detecting, by using the detector, the charged particle beam after passing through the specimen and the second vacuum window.

18. The method according to claim 11, wherein the system further comprises a laser radar module outside the column; accordingly, the method further comprises:

determining a sucking position of the suction cup structure by the laser radar module when the charged particle generating device is being moved.

\* \* \* \* \*